(12) United States Patent
Okashita et al.

(10) Patent No.: US 11,548,194 B2
(45) Date of Patent: Jan. 10, 2023

(54) METHOD FOR MANUFACTURING FLUID DEVICE COMPOSITE MEMBER

(71) Applicant: Sumitomo Riko Company Limited, Aichi (JP)

(72) Inventors: Katsumi Okashita, Aichi (JP); Shota Hayashi, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 345 days.

(21) Appl. No.: 16/867,556

(22) Filed: May 5, 2020

(65) Prior Publication Data

US 2020/0262113 A1 Aug. 20, 2020

Related U.S. Application Data

(63) Continuation of application No. PCT/JP2018/039105, filed on Oct. 19, 2018.

(30) Foreign Application Priority Data

Mar. 30, 2018 (JP) .............................. JP2018-066609

(51) Int. Cl.
*B01L 3/00* (2006.01)
*B29C 45/14* (2006.01)
(Continued)

(52) U.S. Cl.
CPC .. *B29C 45/14336* (2013.01); *B01L 3/502707* (2013.01); *B81C 99/0085* (2013.01);
(Continued)

(58) Field of Classification Search
CPC . B29C 45/14336; B29C 33/424; B29C 45/14; B01L 3/502707; B01L 2200/12;
(Continued)

(56) References Cited

U.S. PATENT DOCUMENTS

2006/0210445 A1   9/2006   Osterfeld et al.

FOREIGN PATENT DOCUMENTS

| JP | 2004325153 | 11/2004 |
|----|------------|---------|
| JP | 2004330038 | 11/2004 |

(Continued)

OTHER PUBLICATIONS

"International Search Report (Form PCT/ISA/210) of PCT/JP2018/039105", dated Jan. 22, 2019, with English translation thereof, pp. 1-8.

(Continued)

*Primary Examiner* — Dennis White
(74) *Attorney, Agent, or Firm* — JCIPRNET (57) ABSTRACT

A fluid device composite member includes: a silicone member that includes a body part which is made of silicone and which has a flow-path-defining section for defining a flow path on one surface of the body part, and that includes barrier layer having hydrophilicity or hydrophobicity disposed in at least a portion of the flow-path-defining section; and a resin substrate disposed on another surface of the body part opposite to the one surface. This method for manufacturing the fluid device composite member includes a layered body manufacturing step in which a liquid silicone material is placed on a surface of the resin substrate, and the liquid silicone material is cured at a temperature of 100° C. or less to obtain a layered body in which a silicone cured product is bonded to the resin substrate.

9 Claims, 5 Drawing Sheets

(51) Int. Cl.
*B81C 99/00* (2010.01)
*B29K 83/00* (2006.01)
*B29L 31/00* (2006.01)

(52) U.S. Cl.
CPC ... *B01L 2200/12* (2013.01); *B01L 2300/0887* (2013.01); *B01L 2300/123* (2013.01); *B01L 2300/161* (2013.01); *B29K 2083/005* (2013.01); *B29L 2031/756* (2013.01)

(58) Field of Classification Search
CPC ....... B01L 2300/0887; B01L 2300/123; B01L 2300/161; B01L 2200/0668; B81C 99/0085; B29K 2083/005; B29K 2083/00; B29L 2031/756; B01J 19/00; B32B 3/30; B32B 25/08; B32B 25/20; G01N 37/00
See application file for complete search history.

(56) References Cited

FOREIGN PATENT DOCUMENTS

| | | | |
|---|---|---|---|
| JP | 2006181407 | 7/2006 | |
| JP | 2013188677 | 9/2013 | |
| JP | 2017154036 | 9/2017 | |
| WO | 2015098719 | 7/2015 | |
| WO | WO-2015098719 A1 * | 7/2015 | ........ B01L 3/502707 |

OTHER PUBLICATIONS

"Office Action of Japan Counterpart Application", dated Jul. 6, 2021, with English translation thereof, pp. 1-12.
"Written Opinion of the International Searching Authority (Form PCT/ISA/237) of PCT/JP2018/039105," dated Jan. 22, 2019, with English translation thereof, pp. 1-26.

* cited by examiner

METHOD FOR MANUFACTURING FLUID DEVICE COMPOSITE MEMBER

CROSS-REFERENCE TO RELATED APPLICATIONS

This application is a continuation application of International Application number PCT/JP2018/039105 on Oct. 19, 2018, which claims the priority benefit of Japan Patent Application No. 2018-066609, filed on Mar. 30, 2018. The entirety of each of the above-mentioned patent applications is hereby incorporated by reference herein and made a part of this specification.

TECHNICAL FIELD

The present disclosure relates to a composite member used for a fluid device having a fine flow path and a method for manufacturing the same.

BACKGROUND ART

When a microfluidic device having a fine flow path is used, various operations such as reaction, extraction, separation, and measurement can be performed with a very small amount of sample in a short time. Glass is generally used as a material for a member constituting the microfluidic device. However, processes such as photolithography and dry etching are required to form fine irregularities on a glass member. For this reason, it takes time to manufacture the member and thus the productivity is low. Further, when a member is made of glass, there is a problem that it cannot be discarded by incineration. Therefore, silicone is attracting attention as a material that can replace glass, because it is easily processed finely and has excellent light transmission and chemical resistance properties.

PATENT LITERATURE

Patent Literature 1

Japanese Patent Laid-Open No. 2006-181407

Patent Literature 2

Japanese Patent Laid-Open No. 2017-154036

Patent Literature 3

Japanese Patent Laid-Open No. 2004-325153

A microfluidic device used for optical inspection using a microscope is small and thin. For this reason, if silicone is used as a material for the device, handling is difficult due to its softness. In addition, silicone is sticky. Therefore, for example, when the device is installed on a sample stage of a microscope, the device slides poorly and sticks to the sample stage, and thus aligning is difficult. Even after the inspection is completed, it is difficult to remove the device because of its high adhesion to the sample stage. In addition, if air bubbles enter between the sample stage and the device, it is difficult to remove the air bubbles, and therefore there is a concern that the device may be slightly deformed and the microscope may not be focused. Furthermore, since silicone is easily charged, there is also a problem that dust in the air is easily adsorbed to silicone.

Also, a silicone member has a lower affinity for water than a glass member. For this reason, when a hydrophilic liquid is caused to flow through a flow path, a desired operation may not be performed accurately due to poor flowability. In addition, there is a problem that a component required to be captured cannot easily enter a recess formed on the member. Accordingly, when a silicone member is used, a treatment for imparting hydrophilicity to a flow path may be performed (for example, see Patent Literatures 1 and 2).

As described above, a silicone member is easily deformed at the time of handling (when installed on a sample stage, when removed, etc.) due to its softness. Accordingly, when a surface treatment is performed on a silicone member to form a barrier layer such as a hydrophilic layer, there is a concern that the barrier layer may crack or break due to deformation and a desired effect may not be provided.

The present disclosure provides a fluid device composite member which has excellent handleability while using silicone. Also, the present disclosure provides a manufacturing method in which the fluid device composite member can be easily manufactured.

SUMMARY (1) A fluid device composite member of the present disclosure is characterized by including: a silicone member that has a body part which is made of silicone and has a flow-path-defining section for defining a flow path on one surface of the body part, and barrier layer having hydrophilicity or hydrophobicity disposed in at least a portion of the flow-path-defining section; and a resin substrate disposed on another surface of the body part opposite to the one surface.

(2) A method for manufacturing a fluid device composite member of the present disclosure is a method for manufacturing a fluid device composite member which includes a silicone member that has a body part which is made of silicone and has a flow-path-defining section for defining a flow path on one surface of the body part, and a resin substrate disposed on another surface of the body part opposite to the one surface, the method being characterized by having a laminated body manufacturing step in which a liquid silicone material is placed on a surface of the resin substrate, and the liquid silicone material is cured at a temperature of 100° C. or less to obtain a laminated body in which a silicone cured product is bonded to the resin substrate.

DESCRIPTION OF EMBODIMENTS (1) The fluid device composite member of the present disclosure includes the silicone member and the resin substrate. The resin substrate is disposed on another surface opposite to the one surface on a side forming the flow path in the silicone member. That is, the resin substrate is disposed to support the silicone member. In the fluid device composite member of the present disclosure, since the silicone member is supported by the resin substrate, rigidity of the entire composite member is increased and thus shape retainability is improved. Therefore, the fluid device composite member of the present disclosure is easily handled even if it has the silicone body part.

For example, when the fluid device composite member of the present disclosure is installed on a sample stage of a microscope, it is placed on the sample stage with the resin substrate side facing downward. In this case, as compared with the case in which the silicone member is directly brought into contact with the sample stage, sliding properties of the composite member are improved and thus aligning is easily done. Also, after an operation such as inspection is completed, the fluid device composite member is easily removed from the sample stage. Even if air bubbles enter between the sample stage and the fluid device composite member, it is not so difficult to remove the bubbles because an adhesion force between the fluid device composite member and the sample stage is small. Further, since another surface of the silicone member is covered with the resin substrate and thus exposure is reduced, dust in the air is not easily adsorbed.

The barrier layer having hydrophilicity or hydrophobicity is disposed in at least a portion of the flow-path-defining section of the silicone body part. For example, in the case in which the flow-path-defining section is configured of a recess for capturing some of a fluid and the other flow path part, when a hydrophilic barrier layer is disposed in the recess, flowability of the recess when a hydrophilic liquid is caused to flow is improved. In this case, since the flow path part other than the recess exposes the silicone and has a low affinity for water, a component required to be captured can be reliably captured in the hydrophilic recess. Thus, a loss of a sample can be reduced and analysis accuracy can be improved. On the other hand, when a hydrophobic barrier layer is disposed in the recess, direct contact between a hydrophobic liquid and the body part is avoided due to the barrier layer when the hydrophobic liquid such as oil or an organic solvent is caused to flow, thereby inhibiting infiltration of the liquid into the body part. Thus, swelling of the body part is inhibited and a possibility that a size of the recess may change is decreased. In addition, when a hydrophilic barrier layer is disposed in the flow path part other than the recess, a hydrophobic fluid does not easily remain in the flow path part. Accordingly, a capture target contained in the hydrophobic fluid does not adhere to the flow path part and can be captured in the recess without leakage.

In this way, by disposing the barrier layers in the flow-path-defining section, analysis accuracy, a response rate, and the like can be improved in accordance with purposes. In the present specification, a case in which a water contact angle measured on the basis of JIS R3257:1999 is less than 80 degrees is defined as hydrophilic, and a case in which the water contact angle is 80 degrees or more is defined as hydrophobic.

The fluid device composite member of the present disclosure has high rigidity and high shape retainability as compared with the case of being configured of only a silicone member. That is, since it is not easily deformed at the time of handling, cracks, breakage, and the like hardly occur in the barrier layer even if the barrier layer is disposed in the flow-path-defining section. Therefore, a desired effect of the barrier layer can be sufficiently provided.

In this regard, Patent Literature 3 discloses a microchip having a sandwich structure in which a polydimethylsiloxane (PDMS) substrate having one surface on which microchannels are arranged is sandwiched between two outer surface members made of a material other than PDMS. In the microchip disclosed in Patent Literature 3, an outer surface member made of a synthetic resin is disposed on the other surface opposite to the one surface of the PDMS substrate. However, the one surface of the substrate is PDMS itself and does not have a barrier layer. For this reason, various problems such as poor flowability, swelling and deformation of the substrate occur depending on a type of liquid for use.

(2) Patent Literature 3 discloses a method in which a PDMS substrate is formed without using a mold and then outer surface members are bonded thereto to manufacture a microchip. However, when the outer surface members are attached to the substrate, as described in paragraph [0020] of Patent Literature 3, an adhesive and a pretreatment agent are required, and various tasks such as smoothing surfaces of the substrate and performing surface modification of both the outer surface members and the substrate are needed.

A thickness of the fluid device composite member is thin on the order of microns. For this reason, in attempts to attach a thin film-shaped silicone member to a thin film-shaped resin substrate, there is a concern that the thin films may be charged and easily stick to hands, etc., thereby adsorbing dust in the air. In addition, they are easily torn because they are thin films, and there is a concern that air bubbles may enter between the two at the time of attaching them. As described above, in attempts to attach the silicone member to the resin substrate, there are many problems.

In this regard, in the method for manufacturing the fluid device composite member according to the present disclosure, the liquid silicone material is disposed on the surface of the resin substrate, and the liquid silicone material is cured, whereby the silicone cured product is bonded to the resin substrate. According to the manufacturing method of the present disclosure, since the silicone cured product is bonded to the resin substrate by utilizing curing of the liquid silicone, problems due to the attaching method described above do not occur.

For example, when a liquid silicone material is injection-molded, it is usually molded at a temperature of about 130° C. in consideration of a curing speed. However, in the manufacturing method of the present disclosure, since it is necessary to cure the liquid silicone material on the surface of the resin substrate, the resin substrate is deformed by heat when the molding is performed at a conventional temperature. As described above, the thickness of the silicone member is thin on the order of microns, and the finer recess is formed therein. For example, when the recess is formed on the one surface simultaneously with the curing of the liquid silicone material, dimensional accuracy of the recess cannot be maintained if the resin substrate is deformed even a little. In this regard, in the manufacturing method of the present disclosure, the liquid silicone material is cured at a lower temperature of 100° C. or less. Thus, curing of the liquid silicone can be realized while inhibiting the deformation of the resin substrate.

Hereinafter, embodiments of a fluid device composite member and a method for manufacturing the same according to the present disclosure will be described.

First Embodiment

[Configuration of Fluid Device Composite Member]

Figure 1:
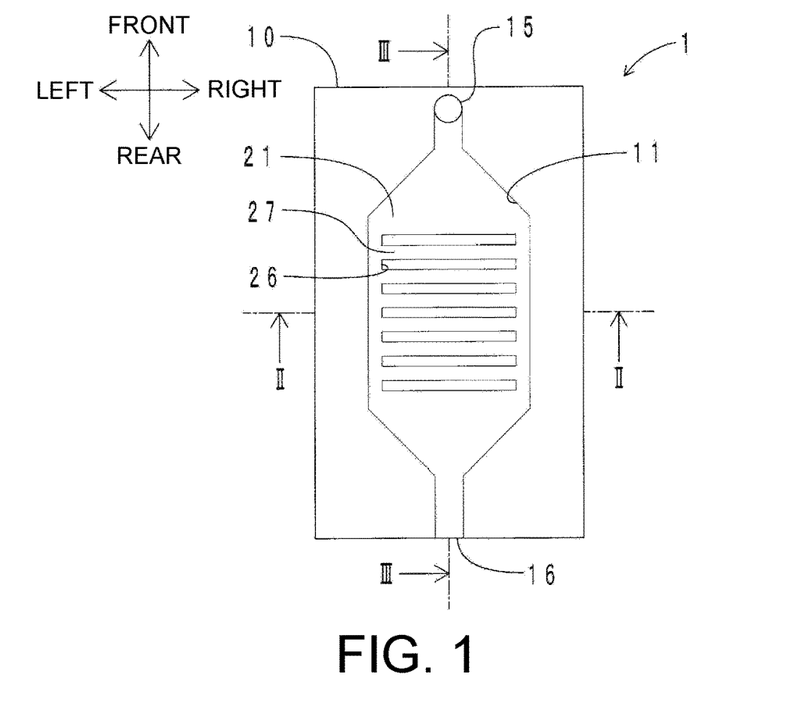
FIG. 1 is a transparent top view of a fluid device including a fluid device composite member according to a first embodiment.
Figure 2:
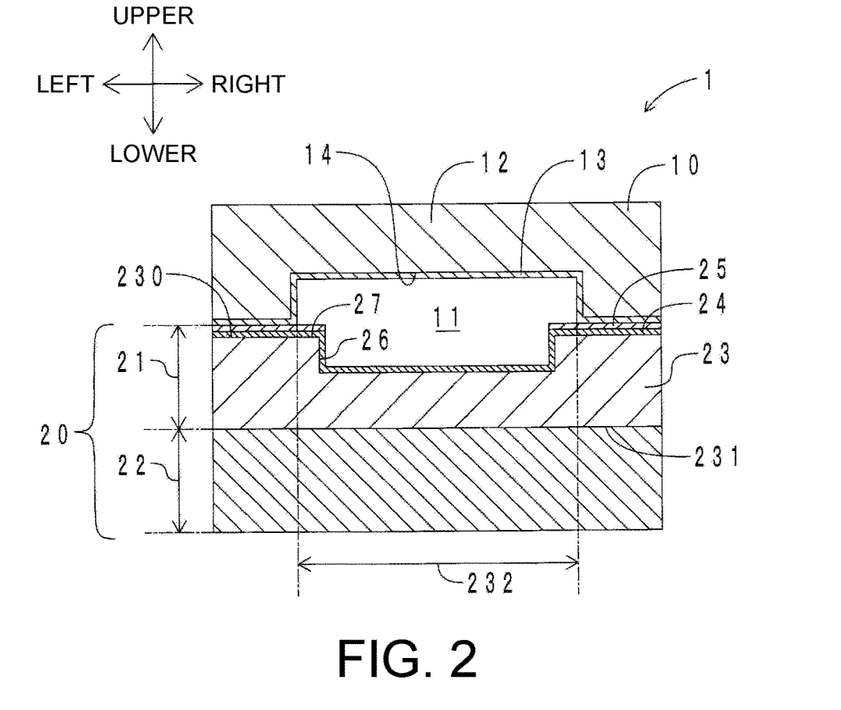
FIG. 2 is a cross-sectional view of the fluid device along line II-II.
Figure 3:
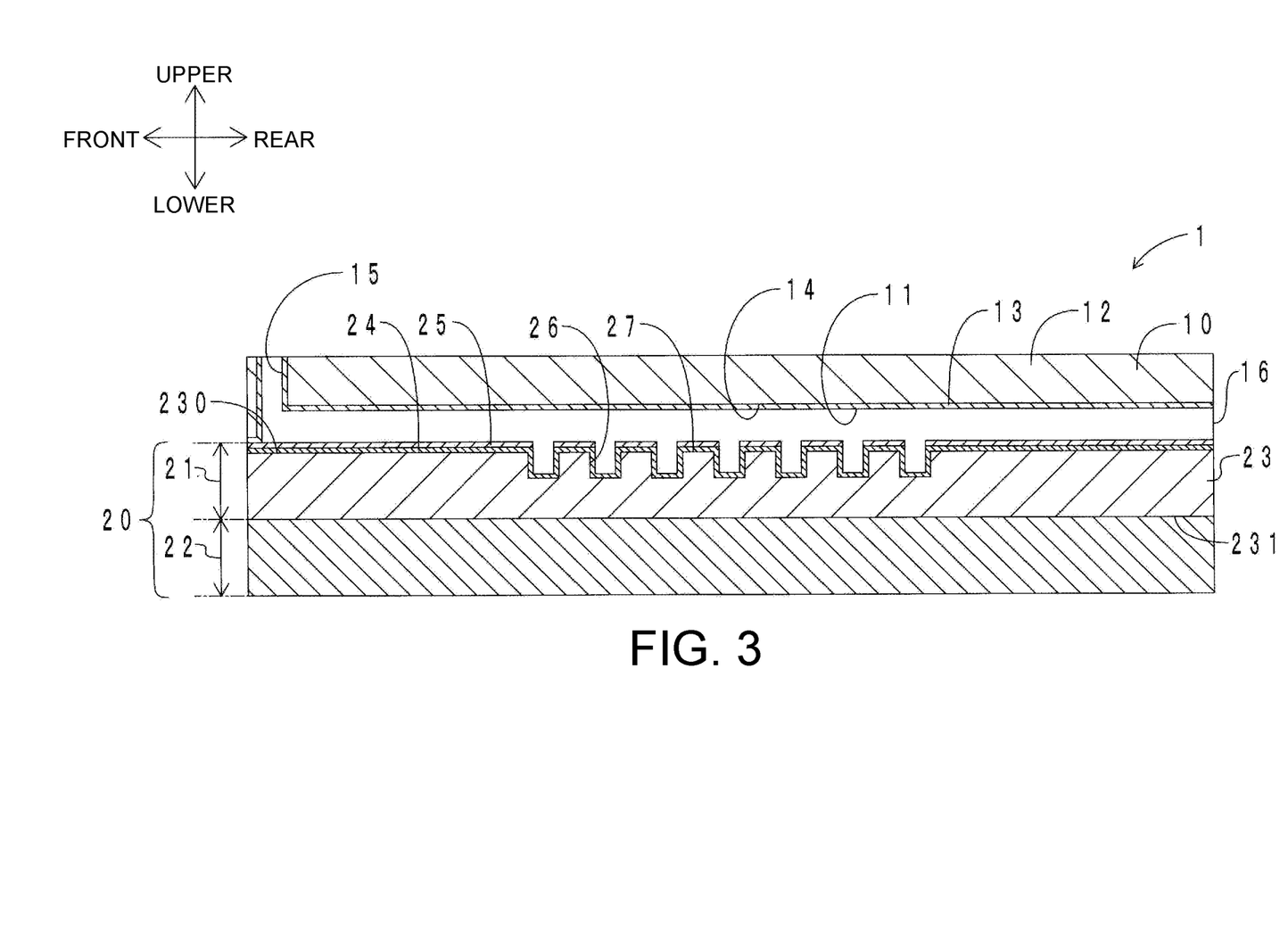
FIG. 3 is a cross-sectional view of the fluid device along line III-III.

First, a configuration of a fluid device composite member according to a first embodiment will be described. FIG. 1 shows a transparent top view of a fluid device including the fluid device composite member of the first embodiment. FIG. 2 shows a cross-sectional view of the fluid device along line II-II. FIG. 3 shows a cross-sectional view of the fluid device along line III-III. In the present embodiment, the fluid device composite member is embodied as a lower member of the fluid device. In the following figures, a vertical direction corresponds to a thickness direction of the fluid device.

As shown in FIGS. 1 to 3, a fluid device 1 has an upper member 10 and a lower member 20. The upper member 10 and the lower member 20 are laminated in the vertical direction. A flow path 11 is defined between the upper member 10 and the lower member 20.

The upper member 10 has an upper substrate 12 and a hydrophilic layer 13. The upper substrate 12 is made of silicone rubber (polydimethylsiloxane (PDMS)) and has a rectangular plate shape. An upper recess 14 is formed on a lower surface of the upper substrate 12. An introduction hole 15 that penetrates the upper substrate 12 in the vertical direction is formed at a center of a front end portion of the upper substrate 12. An upstream end of the flow path 11 communicates with the introduction hole 15. A discharge port 16 that opens to a rear surface thereof is disposed at a downstream end of the flow path 11. The hydrophilic layer 13 is disposed on the entire lower surface of the upper substrate 12 including an inner circumferential surface of the introduction hole 15. The hydrophilic layer 13 is a silicon oxide film containing an organic component.

The lower member 20 has a silicone member 21 and a resin substrate 22. A thickness of the silicone member 21 is 100 μm. The silicone member 21 has a body part 23, a hydrophobic layer 24, and a hydrophilic layer 25. The body part 23 is made of silicone rubber containing PDMS, a platinum catalyst, and organopolysiloxane (an adhesive component), and has a rectangular plate shape. The body part 23 has an upper surface 230 and a lower surface 231. The upper surface 230 has a flow-path-defining section 232 that defines the flow path 11 between the upper surface 230 and the upper member 10. Seven groove-shaped lower recesses 26 are formed near a center of the upper surface 230. Each of the lower recesses 26 has a linear shape extending in a lateral direction thereof. The lower recesses 26 are disposed in parallel at predetermined intervals in a longitudinal direction thereof. A vertical cross-section of the lower recess 26 has a rectangular shape. The flow-path-defining section 232 is configured of the lower recesses 26 and other flow path parts 27. The lower recesses 26 capture some of a fluid flowing through the flow path 11.

The hydrophobic layer 24 is disposed on the entire upper surface 230 of the body part 23 including the lower recesses 26. The hydrophobic layer 24 is a fluorocarbon film. The hydrophilic layer 25 is disposed to cover an upper surface of the hydrophobic layer 24 in a region excluding the lower recesses 26. The hydrophilic layer 25 is a silicon oxide film. As a result, surfaces of the lower recesses 26 of the flow-path-defining section 232 are covered with the hydrophobic layer 24, and surfaces of the flow path parts 27 are covered with the hydrophobic layer 24 and the hydrophilic layer 25. An outermost layer of the flow path part 27 is the hydrophilic layer 25. The hydrophobic layer 24 and the hydrophilic layer 25 are included in the concept of a barrier layer in the present disclosure.

The resin substrate 22 is bonded to the lower surface 231 of the body part 23 of the silicone member 21. The resin substrate 22 is made of a polypropylene resin and has a rectangular plate shape. A thickness of the resin substrate 22 is 100 μm. The thickness of the resin substrate 22 is 50% when a thickness of the entire lower member 20 is 100%.

[Method for Manufacturing Fluid Device Composite Member]

Figure 4:
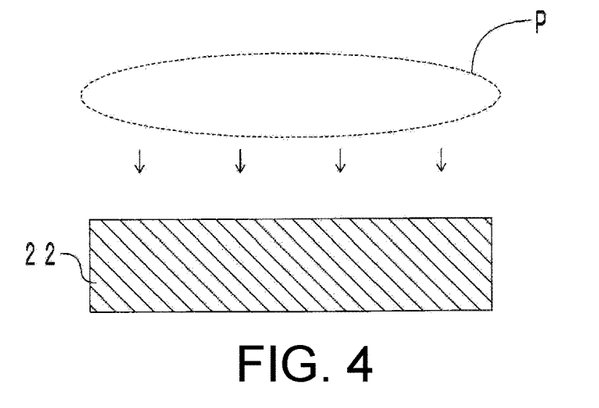
FIG. 4 is a schematic view of a modifying step in manufacturing a lower member of the fluid device.
Figure 5:
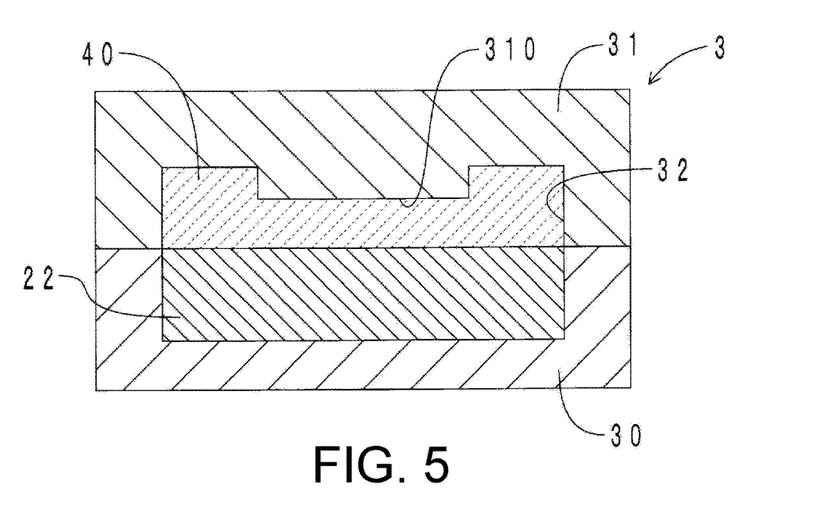
FIG. 5 is a schematic view of a laminated body manufacturing step in manufacturing the lower member.
Figure 6:
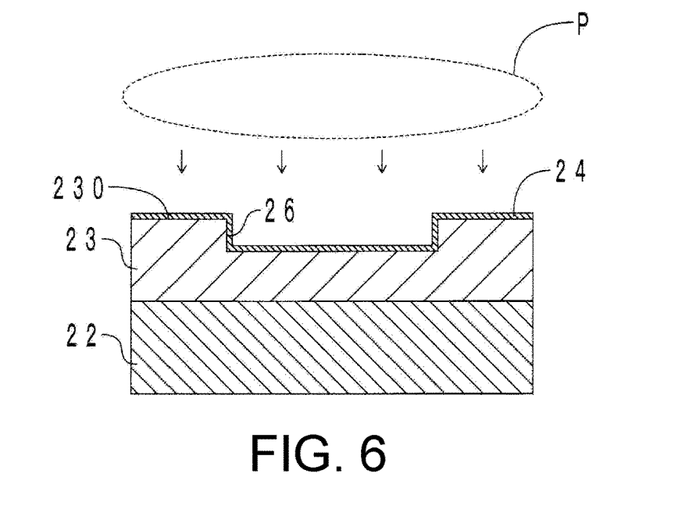
FIG. 6 is a schematic view of a hydrophobic layer forming step in manufacturing the lower member.
Figure 7:
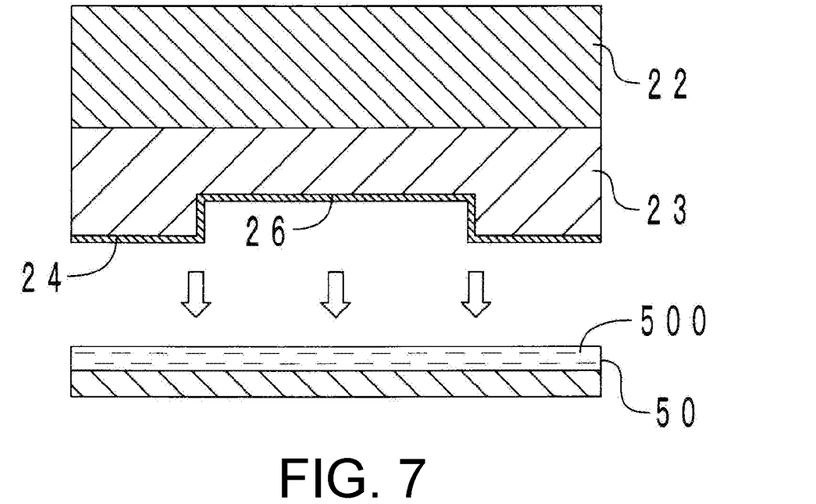
FIG. 7 is a schematic view of a hydrophilic layer forming step in manufacturing the lower member.
Figure 8:
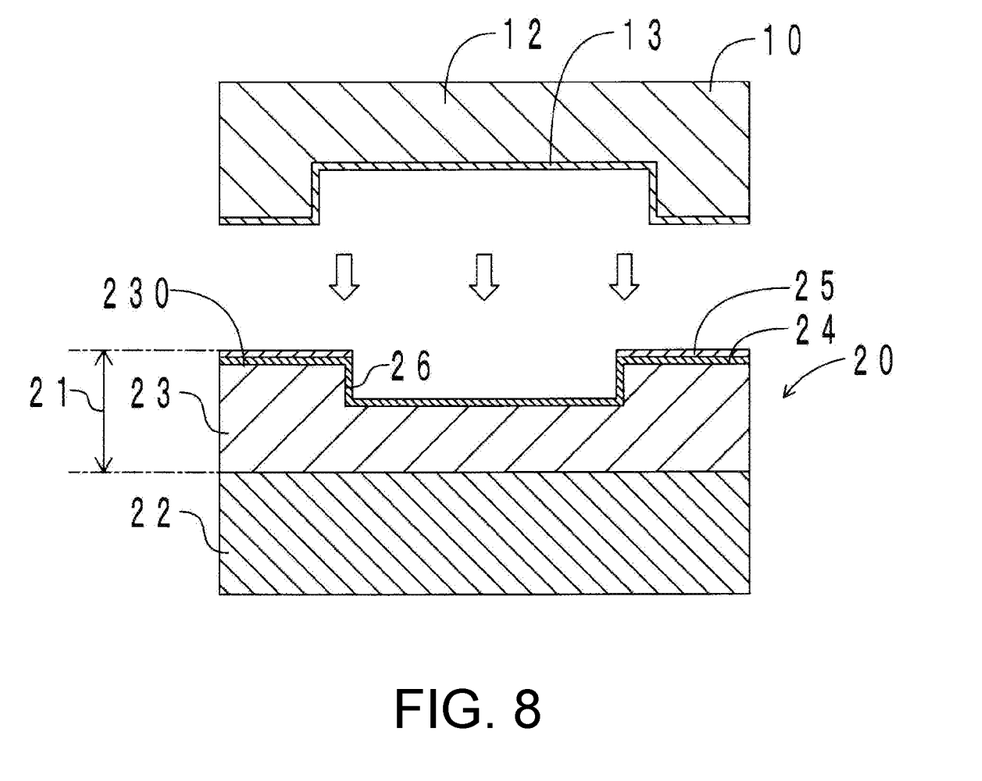
FIG. 8 is a schematic view of a laminating step in manufacturing the fluid device.

Next, a method for manufacturing the fluid device composite member of the present embodiment will be described while describing a method for manufacturing the fluid device 1. FIG. 4 shows a modifying step in manufacturing the lower member of the fluid device. FIG. 5 shows a laminated body manufacturing step in manufacturing the lower member. FIG. 6 shows a hydrophobic layer forming step in manufacturing the lower member. FIG. 7 shows a hydrophilic layer forming step in manufacturing the lower member. FIG. 8 shows a laminating step of the upper member and the lower member in manufacturing the fluid device.

As shown in FIG. 4, in the modifying step, a surface of the resin substrate 22 is irradiated with microwave plasma P in a gas atmosphere containing oxygen to perform a modifying treatment. Hydroxyl groups are applied to the surface of the resin substrate 22 through the modifying treatment.

As shown in FIG. 5, in the laminated body manufacturing step, the resin substrate 22 is disposed in a first mold 30 of a mold 3 with the surface that has been modified facing upward, and the first mold 30 and a second mold 31 are clamped to each other. A second mold surface 310 of the second mold 31 has a shape in which irregularities are opposite to those of the upper surface 230 of the body part 23. Then, a liquid silicone material 40 is injection-molded in a cavity 32 of the mold 3 at a temperature of 80° C. The liquid silicone material 40 contains PDMS, a platinum catalyst, and organopolysiloxane (an adhesive component). When the liquid silicone material 40 is cured and molding is completed, the mold is removed to obtain a laminated body in which the silicone cured product is bonded to the resin substrate 22. The silicone cured product obtained in this step has the recesses formed on a surface opposite to a surface bonded to the resin substrate 22. That is, in this step, the laminated body in which the body part 23 is bonded to the resin substrate 22 is manufactured.

As shown in FIG. 6, in the hydrophobic layer forming step, the upper surface 230 of the body part 23 is irradiated with microwave plasma P in an atmosphere containing a fluorocarbon gas to form a fluorocarbon film. Thus, the hydrophobic layer 24 is formed on the entire upper surface 230 including the lower recesses 26. Subsequently, as shown in FIG. 7, in the hydrophilic layer forming step, the laminated body configured of the body part 23 and the resin substrate 22 is reversed and the hydrophobic layer 24 side of the body part 23 is pressed against a stamp member 50. The stamp member 50 is impregnated with a reagent 500 containing polysilazane in advance. As a result, the polysilazane liquid attaches to the surface of the hydrophobic layer 24 other than the lower recesses 26. Thereafter, the attached polysilazane liquid is dried to form a silicon oxide film as the hydrophilic layer 25 on the surface of the hydrophobic layer 24 other than the lower recesses 26. In this way, the hydrophobic layer 24 and the hydrophilic layer 25 are formed on the upper surface 230 of the body part 23 as shown in FIG. 8, which will be described later. The hydrophobic layer forming step and the hydrophilic layer forming step are included in the concept of a barrier layer forming step in the present disclosure.

Separately, the entire lower surface of the upper substrate 12 is irradiated with microwave plasma in an atmosphere containing tetraethoxysilane (TEOS) gas to form a silicon oxide film (the hydrophilic layer 13) containing an organic component. Then, as shown by outline arrows in FIG. 8, in the laminating step, the upper member 10 is overlaid on the laminated body (lower member 20) configured of the silicone member 21 and the resin substrate 22 to manufacture the fluid device 1 shown in FIG. 2 described above.

[Operations and Effects]

Next, operations and effects of the fluid device composite member and the method for manufacturing the same according to the present embodiment will be described. In the fluid device 1 of the present embodiment, the fluid injected from the introduction hole 15 flows through the flow path 11 and is discharged from the discharge port 16. For example, in the case in which a hydrophobic sample liquid in which particles are dispersed in an organic solvent is caused to flow through the fluid device 1, direct contact between the sample liquid and the body part 23 is avoided due to the hydrophobic layer 24 and the hydrophilic layer 25. For this reason, the sample liquid hardly infiltrates into the body part 23, and swelling of the body part 23 is inhibited. Therefore, deformation of the silicone member 21 is inhibited, and a size of the lower recess 26 does not easily change. In addition, the lower recess 26 is covered with the hydrophobic layer 24, and the outermost layer of the flow path part 27 is the hydrophilic layer 25. Further, the hydrophilic layer 13 is also disposed on the entire lower surface of the upper substrate 12 that forms the flow path 11. Since all the portions other than the lower recesses 26 in the flow path 11 have hydrophilicity, the hydrophobic sample liquid is unlikely to attach to and remain on portions other than the lower recesses 26. Therefore, desired particles in the sample liquid can be captured in the lower recesses 26 without leakage.

The lower member 20 includes the silicone member 21 and the resin substrate 22. The resin substrate 22 is disposed on another surface (lower surface 231) opposite in the thickness direction to the one surface (upper surface 230) of the silicone member 21 on the side on which the flow path 11 is formed. The thickness of the resin substrate 22 is 50% (half) of the thickness of the entire lower member 20. By supporting the silicone member 21 with the resin substrate 22, rigidity of the entire lower member 20 increases, and thus shape retainability increases. Therefore, handleability is improved as compared with the case in which the silicone member 21 is used alone. The resin substrate 22 is made of a polypropylene resin (an olefin resin). Since an olefin resin does not have autofluorescence, it can also be used for optical inspection or the like in which light is irradiated from below the lower member 20 to observe extremely weak light emission in the lower recesses 26.

When the fluid device 1 is placed on a sample stage of a microscope with the resin substrate 22 side facing downward, sliding properties of the resin substrate 22 are higher than those of the silicone member 21, and thus aligning is easily done. In addition, the fluid device 1 is easily removed from the sample stage even after an operation such as inspection is completed. Even if air bubbles enter between the sample stage and the resin substrate 22, it is not so difficult to remove the air bubbles because the adhesion force to the sample stage is small. Further, since an exposed area of the silicone member 21 is small, dust in the air is not easily adsorbed.

According to the method for manufacturing the fluid device composite member (lower member) of the present embodiment, the liquid silicone material 40 is injection-molded on the surface of the resin substrate 22. Since the silicone member 21 and the resin substrate 22 are bonded by utilizing curing of the liquid silicone material 40, the bonding is easy and defects are less likely to occur as compared with a method of attaching the silicone member and the resin substrate as conventionally used. In addition, in the manufacturing method of the present embodiment, the liquid silicone material 40 is cured at a temperature of 80° C. Therefore, the resin substrate 22 is not easily deformed, and the dimensional accuracy of the fine lower recesses 26 in the silicone member 21 can be maintained. The liquid silicone material 40 contains PDMS, a platinum catalyst, and organopolysiloxane (an adhesive component). By including the platinum catalyst, the liquid silicone material 40 can be cured even at a low temperature of 100° C. or less. Moreover, bonding properties to the resin substrate 22 improve when the adhesive component is included. Further, the surface of the resin substrate 22 is subjected to the modifying treatment. The bonding properties between the silicone member 21 and the resin substrate 22 can be further enhanced due to the effects of both the adhesive component and the modifying treatment.

In the laminated body manufacturing step, the second mold 31 having the second mold surface 310 having the shape in which irregularities are opposite to those of the upper surface 230 of the body part 23 has been used. Thus, the laminated body in which the body part 23 having the lower recesses 26 and the flow path parts 27 is bonded to the resin substrate 22 can be manufactured only by injection molding.

In the manufacturing method of the present embodiment, the hydrophobic layer 24 is formed by a plasma chemical vapor deposition (CVD) method using microwave plasma. When microwave plasma is used, productivity is high due to a high film deposition rate. In addition, plasma damage to the body part 23 is small. Further, when the hydrophilic layer 25 is formed, a transfer method in which the polysilazane liquid is transferred to the surface of the hydrophobic layer 24 has been employed. Thus, the hydrophilic layer 25 can be easily formed in portions other than the lower recesses 26. As described above, according to the manufacturing method of the present embodiment, since the entire lower recesses 26 are covered with the hydrophobic layer 24, the flow path parts 27 are covered with the hydrophobic layer 24 and the hydrophilic layer 25, and the body part 23 in which the outermost layer of the flow path parts 27 is the hydrophilic layer 25 can be easily manufactured.

Other Embodiments

As described above, although the embodiments of the fluid device composite member and the method for manufacturing the same according to the present disclosure have been illustrated, the configuration of the fluid device including the fluid device composite member of the present disclosure is not limited to the above embodiment. For example, a material of a counterpart member laminated on the fluid device composite member of the present disclosure may be a fluororesin, glass, etc., in addition to silicone such as PDMS. A shape and a size of the counterpart member are not limited at all. The fluid device composite member of the present disclosure and the counterpart member may be simply laminated or may be bonded using an adhesive or the like.

Also, the fluid device composite member of the present disclosure and the method for manufacturing the same are not limited to the above-described embodiments, and can be implemented in various forms in which modifications, improvements, and the like that may be performed by those skilled in the art have been made without departing from the gist of the present disclosure. Next, the fluid device composite member of the present disclosure and the method for manufacturing the same will be described in detail.

[Fluid Device Composite Member]

(1) Resin Substrate

As the material for the resin substrate, a material that can improve problems such as softness, adhesiveness, and charging properties of the silicone member may be selected. For example, an olefin resin or an acrylic resin is desirably used from the viewpoint of being relatively hard, excellent in light transmittance, and having little autofluorescence. For example, a polypropylene resin, a cyclic olefin resin, a polymethyl methacrylate resin, and the like are preferable.

If the resin substrate is laminated on the silicone member, it does not necessarily need to be bonded. However, it is desirable that the two be bonded from the viewpoint of improvement in handleability and prevention of deterioration due to long-term storage and the like, such as separation due to moisture intrusion into an interface between the resin substrate and the silicone member, deterioration of optical properties, or the like. Here, the term "bonding" includes bonding by a chemical bond such as cross-linking bonding, in addition to bonding by an adhesive or the like. In order to improve the bonding properties between the resin substrate and the silicone member, it is desirable that the surface of the resin substrate bonded to the silicone member be subjected to a modification treatment in advance. The modification treatment may be performed by plasma irradiation, excimer light irradiation, ultraviolet irradiation, application of a silane coupling agent, or the like under atmospheric pressure or vacuum. In the case in which plasma irradiation is employed, a method for generating plasma is not particularly limited. For example, RF plasma using a high frequency (RF) power source or microwave plasma using a microwave power source may be employed. The plasma irradiation is preferably performed in an atmosphere containing a rare gas such as argon or in a gas atmosphere containing oxygen.

A thickness of the fluid device composite member may be appropriately determined depending on purposes. For example, when it is used for optical inspection using a microscope, the thickness is desirably 1 mm or less or 750 μm or less, more desirably 500 μm or less. Here, the thickness of the resin substrate is preferably 40% or more, more preferably 50% or more of the total thickness of the composite member, from the viewpoint of increasing the rigidity of the fluid device composite member.

(2) Silicone Member

The silicone member has the silicone body part and the barrier layers. In the present specification, the term "silicone" has a concept including both a silicone resin and a silicone rubber. As a preferable example of the body part, an aspect in which it is made of a silicone rubber having a platinum catalyst may be exemplified. By blending the platinum catalyst, the curing temperature of the liquid silicone material can be lowered. Therefore, when a method in which the liquid silicone material is disposed on the surface of the resin substrate and is cured at a predetermined temperature is employed, it can be cured at a lower temperature than usual. Thus, deformation of the resin substrate can be inhibited. A content of the platinum catalyst may be appropriately determined in consideration of a curing temperature, a curing rate, optical properties of the body part, and the like. For example, if the content of the platinum catalyst is high, the curing temperature decreases. However, there are problems that, for example, pot life is shortened, haze (turbidity) increases thereby decreasing optical properties, and the costs increase.

As a preferable example of the body part, an aspect in which it is made of a silicone rubber having an adhesive component may be exemplified. By blending the adhesive component, the bonding properties to the resin substrate can be enhanced. As the adhesive component, a compound having a phenyl group is desirable. Since the compound having a phenyl group has low compatibility with a silicone rubber, it is thought that it bleeds to the interface and contributes to the bonding to the resin substrate. As the compound having a phenyl group, organopolysiloxane and silane coupling agents may be exemplified.

One surface of the body part has the flow-path-defining section that defines the flow path. The flow path may be formed only by the body part or may be formed by the body part and a counterpart member. A fluid flowing through the flow path may be hydrophobic or hydrophilic. The flow-path-defining section can be configured of recesses for capturing some of the fluid and other flow path parts. Some of the fluid captured in the recesses may be some of the fluid itself or may be only a specific substance contained in the fluid.

Sizes, shapes, and an arrangement of the recesses are not particularly limited. For example, the recess may have a groove shape or a depression shape. A cross-section in a depth direction of the recess may be a rectangular shape such as a square, a rectangle or a trapezoid, a curved shape such as a semicircle or an ellipse, or a V shape.

The barrier layer having hydrophilicity or hydrophobicity is disposed in at least a portion of the flow-path-defining section. In the case in which the flow-path-defining section is configured of the recesses and other flow path parts, the barrier layer is disposed only on the recesses, only on the flow path parts, or on the whole or part of the recesses and the flow path parts. The barrier layer may change between hydrophilicity and hydrophobicity depending on a place in which it is disposed. The barrier layer may be a single layer of a hydrophilic layer or a hydrophobic layer, or a laminate thereof. The barrier layer may be formed through modification or may be formed through film deposition.

For example, when the hydrophobic layer is formed through modification, a surface of a modification target may be modified with hydrocarbons by using plasma irradiation in a gas atmosphere containing carbon and hydrogen, irradiation with excimer light, extreme surface annealing by short-time pulse overheating, and the like, thereby applying a hydrophobic functional group such as a phenyl group ($-C_6H_5$) or a methyl group ($-CH_3$) to the surface. When the hydrophobic layer is formed through film deposition, a fluororesin film or the like may be formed in addition to the fluorocarbon film of the above embodiment. In this case, the film may be a monomolecular film. The hydrophobic layer may have oil repellency or the like in addition to hydrophobicity depending on purposes.

When the hydrophilic layer is formed through modification, similarly to the hydrophobic layer, a hydroxyl group, an amino group, a C—N bond, a C=O bond, an amide bond (O=C—N) or the like may be applied to the surface of the modification target. When the hydrophilic layer is formed through film deposition, a metal oxide film, a metal oxide film containing an organic component, or the like may be formed. As the metal oxide, silicon oxide, titanium oxide, aluminum oxide, and zinc oxide may be exemplified. In this case, the film may be a monomolecular film.

In the metal oxide film containing an organic component, an affinity for water and hardness of a layer vary depending on a content of carbon. If the content is high, a softer layer is formed. Thus, an affinity with a counterpart member is improved and thus adhesion is improved. On the other hand, when the content of carbon is low, a hard layer close to amorphous is formed. Thus, the effect of inhibiting infiltration of a liquid increases. For example, by configuring the barrier layer with a metal oxide film containing an organic component and changing the content of carbon for each place in which it is disposed, the affinity (hydrophobicity or hydrophilicity) for water may be changed. In addition, the barrier layer may be formed in a layered structure to increase the content of carbon in a layer in contact with a counterpart member, thereby improving the adhesion.

[Method for Manufacturing Fluid Device Silicone Member]

A method for manufacturing a fluid device silicone member according to the present disclosure may include a modifying step, a barrier layer forming step, a recess forming step, and the like in addition to a laminated body manufacturing step. Hereinafter, each step will be described.

(1) Modifying Step

This step is a step of modifying a surface of the resin substrate before the laminated body manufacturing step, which will be described later. Although this step is not necessarily required, bonding properties between the resin substrate and the silicone member are improved by performing modification treatment of the surface of the resin substrate. As described above, the modification treatment may be performed by plasma irradiation, excimer light irradiation, ultraviolet irradiation, application of a silane coupling agent, or the like under atmospheric pressure or vacuum. Above all, vacuum microwave plasma treatment performed in an atmosphere containing a rare gas such as argon or in a gas atmosphere containing oxygen is desirable from the viewpoint that the effect is obtained through a short time treatment, the resin substrate is not easily damaged by heat, and there is no need for waste liquid treatment or drying. Thus, a hydroxyl group can be easily applied to the surface of the resin substrate. Also, a silane coupling agent is desirably applied thereto, for example, from the viewpoint that a technique widely used in the case of using a continuous film-like resin substrate wound in a roll shape or the like is adopted to increase production efficiency.

(2) Laminated Body Manufacturing Step

This step is a step of obtaining the laminated body in which the silicone cured product is bonded to the resin substrate by placing a liquid silicone material on the surface of the resin substrate and curing the liquid silicone material at a temperature of 100° C. or less.

The liquid silicone material contains a curing agent, a catalyst, etc., in addition to a silicone polymer, and as described above, it is particularly desirable to have a platinum catalyst from the viewpoint of lowering a curing temperature. By using the liquid silicone material containing the platinum catalyst, the silicone cured product can be obtained in a practical curing time even at a temperature of 100° C. or less. From the viewpoint of inhibiting deformation of the resin substrate, the curing temperature is preferably 90° C. or less, more preferably 80° C. or less. Further, as described above the liquid silicone material desirably has an adhesive component from the viewpoint of enhancing the bonding properties to the resin substrate. As the adhesive component, a compound having a phenyl group such as an organopolysiloxane or a silane coupling agent is desirable.

This step is desirably performed by an injection molding method using a mold. For example, when the flow-path-defining section has the recesses, a mold surface shape of the mold is designed such that the recesses can be formed in the silicone cured product, whereby the laminated body in which the body part of the silicone member is bonded to the resin substrate can be manufactured only by injection molding.

(3) Barrier Layer Forming Step

This step is a step of forming the barrier layer having hydrophilicity or hydrophobicity in at least a portion of one surface of the silicone cured product after the laminated body manufacturing step. Although this step is not necessarily required, analysis accuracy and a response rate can be improved by disposing the barrier layer in the flow-path-defining section depending on purposes.

As described above, the barrier layer may be a hydrophilic layer or a hydrophobic layer, or a laminate of them. Also, the barrier layer may be formed through modification or may be formed through film deposition. The barrier layer can be formed by various methods including a dry process such as sputtering and vacuum deposition, a wet process such as transfer, spray coating, and dipping, or the like. According to the wet process such as spray coating, it is required to dilute a coating material by adding an organic solvent in order to make a thinner film. In this case, there is a concern that the organic solvent may infiltrate to swell the body part or the body part may be dissolved in the organic solvent and deformed. Therefore, using a dry process is desirable for the forming step. Among the above, a plasma chemical vapor deposition (CVD) method is preferable because a film composition is easily adjusted and manufacturing is easily performed.

In the plasma CVD method, a source gas and a carrier gas are supplied into a vacuum vessel to form a predetermined gas atmosphere, and then plasma is generated to form a film. As a plasma generation method, RF plasma, microwave plasma, or the like may be employed. Among the above, microwave plasma is preferable in that productivity is high because of a high plasma density and a high film deposition rate, plasma damage is small so that it is preferable for forming a thin film, etc. A frequency of the microwave is not particularly limited. 8.35 GHz, 2.45 GHz, 1.98 GHz, 915 MHz, etc. may be exemplified.

The source gas for forming the hydrophobic layer may be appropriately selected in accordance with a type of a film. For example, when a fluorocarbon film is formed, $C_xF_y$ (x and y are arbitrary integers) gas may be used. $C_xF_y$ may contain a hydrogen atom (H) or a halogen atom other than fluorine. Specifically, a gas such as $CH_3F$, $CH_2F_2$, $CHF_3$, $CF_4$, $C_2F_6$, or $C_5F_8$ may be used. Further, these gases may be mixed with oxygen ($O_2$) gas or a carrier gas. As the carrier gas, a rare gas such as argon (Ar) and helium, nitrogen, and the like may be exemplified. A pressure during film deposition may be about 0.1 to 100 Pa.

The source gas for forming the hydrophilic layer may be appropriately selected in accordance with a type of a film. For example, when a metal oxide film containing an organic component is formed, a gas such as hexamethyldisiloxane (HMDSO), TEOS, tetraisopropyl orthotitanate (TTIP), tetraethyl titanate, isopropyl titanate, or the like may be used alone or mixed with oxygen ($O_2$) gas. As the carrier gas, a rare gas such as argon (Ar) and helium, nitrogen, and the like may be exemplified. The pressure during film deposition may be about 1 to 100 Pa.

(4) Recess Forming Step

This step is a step of forming the recesses on one surface of the silicone cured product after the laminated body manufacturing step. As described above, in the laminated body manufacturing step, the recesses may be formed on the one surface of the silicone cured product simultaneously when the laminated body is manufactured. However, the recesses may not be formed in the one surface of the silicone cured product in the laminated body manufacturing step, and may be formed in the one surface of the silicone cured product separately in a main process. As a method for forming the recesses, laser drawing, etching using photolithography, microbead blasting, nanoimprinting, and the like may be exemplified.

EXAMPLES

Next, the present disclosure will be described more specifically with reference to examples.

<Relationship Between Curing Temperature of Liquid Silicone Material and Deformation of Resin Substrate>

A resin substrate made of a polypropylene resin was placed in a mold, and a liquid silicone material was injection-molded at various curing temperatures, and a degree of deformation of the resin substrate in the obtained laminated body was examined. The curing temperature was set in steps of 10° C. in the range of 80 to 130° C. Separately from this, only the liquid silicone material was injection-molded at each set curing temperature, and the shortest time until there was no remaining uncured portion was measured. This measured shortest time was adopted as the curing time at each curing temperature.

A rectangular area of 50 mm square of the resin substrate was used as an inspection area, and the inspection area was further divided into 25 small rectangular equal areas of 10 mm square, and the presence or absence of deformation was examined for each small area. The presence or absence of deformation was determined by both observation with an optical microscope and visual observation in a state in which visible light was transmitted. In addition, results were evaluated such that when appearances of all the small areas are the same, there is no deformation, when the number of small areas whose appearances had changed as compared to other small areas is 1 to 2, there is a slight deformation and when the number of small areas whose appearances had changed as compared to other small areas is 3 or more, there is a deformation. Table 1 summarizes the curing temperature and results of evaluation.

TABLE 1

| Curing Temperature [° C.] | Deformation of Resin Substrate |
| --- | --- |
| 80 | no deformation |
| 90 | no deformation |
| 100 | slight deformation |
| 110 | deformation |
| 120 | deformation |
| 130 | deformation |

As shown in Table 1, when the curing temperature was 80° C. and 90° C., no deformation was observed in the resin substrate. Also, when the curing temperature was 100° C., a portion of the resin substrate was slightly deformed and weak undulation was observed. On the other hand, when the curing temperature was 110° C. or more, the resin substrate was largely deformed. From the above, it was confirmed that when the resin substrate is an olefin resin, it is desirable to set the curing temperature to 100° C. or less.

<Relationship Between Thickness of Resin Substrate and Deflection Amount of Laminated Body>

Figure 9A:
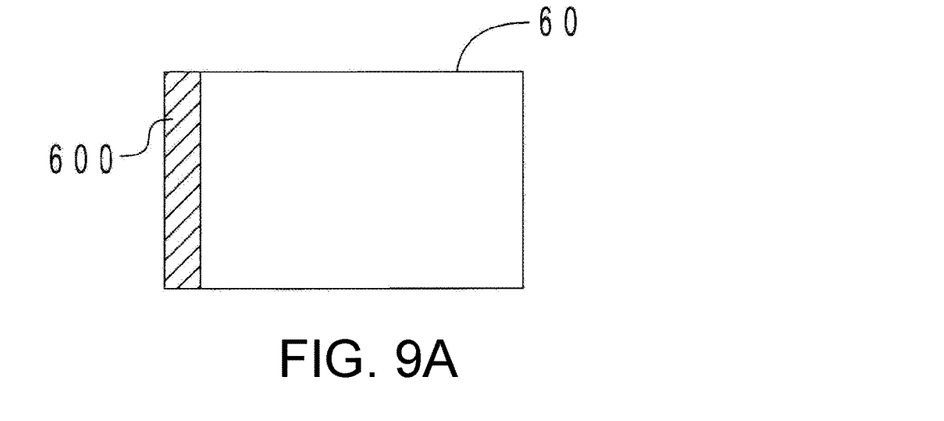
FIG. 9A is a top view of a laminated body used in a deflection amount measuring experiment.
Figure 9B:
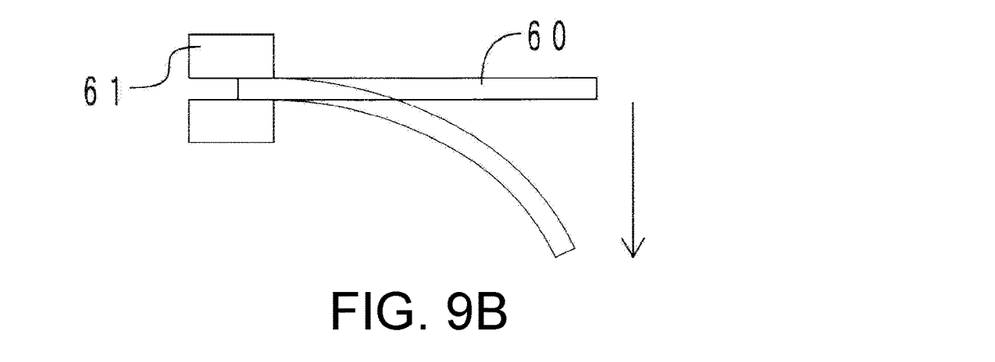
FIG. 9B is a side view of the laminated body in a state in which it is gripped by a jig.
Figure 10:
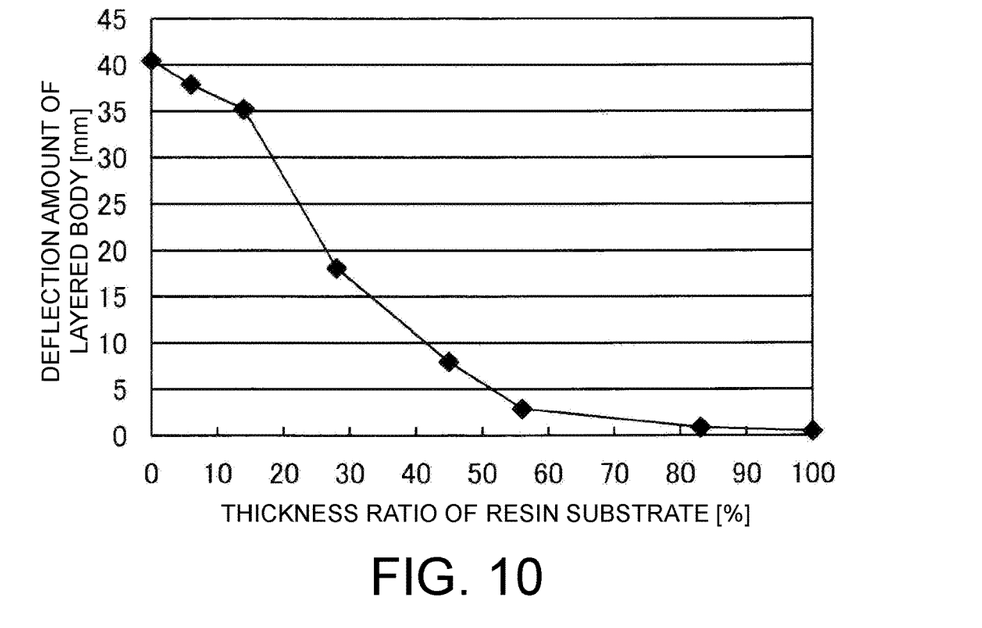
FIG. 10 is a graph showing a deflection amount of the laminated body with respect to a thickness ratio of a resin substrate.

In the laminated body of the resin substrate and the silicone cured product, a deflection amount of the laminated body was measured by changing a thickness ratio of the resin substrate. First, six kinds of rectangular thin film-shaped resin substrates which were made of a polypropylene resin and had different thicknesses of 30 mm length and 50 mm width were prepared. Next, a liquid silicone material was injection-molded at 80° C. on the upper surface of each resin substrate to manufacture layered bodies of the resin substrate and the silicone cured product. Thicknesses of the layered bodies were all 200 µm. That is, the thickness of the silicone cured product was adjusted in accordance with the thickness of the resin substrate. Then, one end of the obtained laminated body in a lateral direction thereof was gripped with a jig, and degree to which the laminated body was deflected due to its own weight was measured. FIG. 9A shows a top view of the laminated body, and FIG. 9B shows a side view of the laminated body gripped by a jig. As shown by hatching in FIG. 9A, a grip part 600 having a width of 5 mm is disposed at the one end of the laminated body 60 in the lateral direction. As shown in FIG. 9B, the grip part 600 is gripped and fixed by a jig 61. A state in which the laminated body 60 was held in a horizontal state was defined as a 0 mm point, and a distance at which the other end on a side opposite to the grip part 600 was lowered due to its own weight was measured to determine it as the deflection amount. FIG. 10 is a graph showing the deflection amount of the laminated body with respect to the thickness ratio of the resin substrate. In addition, in FIG. 10, when the thickness ratio of the resin substrate is 0%, a result of a test piece made of only a silicone cured product is shown, and when it is 100%, a result of a test piece made of only a resin substrate is shown. Shapes and sizes of both test pieces are the same as those of the laminated body (a rectangular thin film shape of 30 mm long, 50 mm wide, and 200 µm thick).

As shown in FIG. 10, the greater the thickness ratio of the resin substrate was, the smaller the deflection amount of the laminated body became. When the case in which the deflection amount of the laminated body was 10 mm or less was evaluated that the rigidity of the laminated body was appropriate, it was confirmed that the preferable thickness of the resin substrate was 40% or more of the total thickness.

The invention claimed is:

1. A method for manufacturing a fluid device composite member comprising a silicone member that comprises a body part which is made of silicone and comprises a flow-path-defining section for defining a flow path on one surface of the body part, and a resin substrate disposed on another surface of the body part opposite to the one surface, comprising:

a laminated body manufacturing step in which a liquid silicone material is placed on a surface of the resin substrate disposed in a first mold, wherein the first mold and a second mold are clamped to each other, a mold surface of the second mold has a shape in which irregularities are opposite to the one surface of the body part, and the liquid silicone material is cured at a temperature of 100° C. or less to obtain a laminated body in which a silicone cured product is bonded to the resin substrate,         wherein the liquid silicone material comprises a platinum catalyst, and the resin substrate is made of an olefin resin or an acrylic resin.

2. The method for manufacturing the fluid device composite member according to claim 1, wherein the liquid silicone material comprises an adhesive component.

3. The method for manufacturing the fluid device composite member according to claim 1, wherein the body part is made of a silicone rubber comprising an adhesive component.

4. The method for manufacturing the fluid device composite member according to claim 3, wherein the adhesive component is made of an organopolysiloxane or a silane coupling agent having a phenyl group.

5. The method for manufacturing the fluid device composite member according to claim 1, further comprising a modifying step of modifying the surface of the resin substrate before the laminated body manufacturing step.

6. The method for manufacturing the fluid device composite member according to claim 1, wherein the laminated body manufacturing step is performed by an injection molding method using the first mold and the second mold.

7. The method for manufacturing the fluid device composite member according to claim 6,     wherein the flow-path-defining section comprises a recess for partially capturing a fluid,     the second mold has a shape for forming the recess in the silicone cured product manufactured in the laminated body manufacturing step, and     the silicone cured product is the body part comprising the flow-path-defining section on one surface thereof.

8. The method for manufacturing the fluid device composite member according to claim 1,     wherein the flow-path-defining section comprises a recess for partially capturing a fluid, and     the method further comprises a recess forming step for forming the recess on one surface of the silicone cured product after the laminated body manufacturing step.

9. The method for manufacturing the fluid device composite member according to claim 1, further comprising a barrier layer forming step of forming a barrier layer having hydrophilicity or hydrophobicity in at least a portion of one surface of the silicone cured product after the laminated body manufacturing step.

\* \* \* \* \*